United States Patent [19]

Onishi

[11] Patent Number: 5,200,361
[45] Date of Patent: Apr. 6, 1993

[54] PROCESS FOR PREPARING A SEMICONDUCTOR DEVICE USING HYDROGEN FLUORIDE AND NITROGEN TO REMOVE DEPOSITS

[75] Inventor: Shigeo Onishi, Nara, Japan

[73] Assignee: Sharp Kabushiki Kaisha, Osaka, Japan

[21] Appl. No.: 772,869

[22] Filed: Oct. 8, 1991

[30] Foreign Application Priority Data

Nov. 15, 1990 [JP] Japan .................. 2-310395

[51] Int. Cl.$^5$ ................ H01L 21/44; H01L 21/465
[52] U.S. Cl. ................... 437/194; 437/228; 156/646; 156/667
[58] Field of Search ............. 437/192, 194, 228; 156/638, 646, 667; 134/3, 31

[56] References Cited

U.S. PATENT DOCUMENTS 4,605,479  8/1986  Faith, Jr. ................. 437/170
4,857,142  8/1989  Syverson ................. 156/653

OTHER PUBLICATIONS van der Heide, et al. "Etching of Thin SiO$_2$ Layers Using Wet HF Gas", *J. Vac. Sci. Tech.*, A7 (3), May/Jun. 1990 pp. 1719-1723.

Burggraf, editor, "Vapor Phase Cleaning at Reduced Pressure", *Semiconductor International*, Dec. 1989 p. 36.

Primary Examiner—John S. Maples
Attorney, Agent, or Firm—Nixon & Vanderhye

[57] ABSTRACT

A process for preparing a semiconductor device includes the steps of forming a lower wiring of aluminum or an aluminum alloy on a semiconductor substrate, coating said lower wiring with an interlayer dielectric film, forming via-holes in said interlayer dielectric film through a patterned resist by a reactive ion etching method, removing deposits produced by said method in said via-holes and a portion of said interlayer dielectric film around said deposits by means of hydrogen fluoride gas and nitrogen gas in the presence or absence of water vapor, and then forming an upper wiring on said interlayer dielectric film.

3 Claims, 3 Drawing Sheets

PROCESS FOR PREPARING A SEMICONDUCTOR DEVICE USING HYDROGEN FLUORIDE AND NITROGEN TO REMOVE DEPOSITS

BACKGROUND OF THE INVENTION

1. Field of the Invention

The present invention relates to a process for preparing a semiconductor device and, more specifically, to a process for forming a via-hole in an interlayer dielectric film provided in a multilayered metal wiring.

2. Prior Art

Conventionally, via-holes on a semiconductor substrate which are required to a multilayered metal wiring are formed by a reactive ion etching using, for example, $SF_6$ gas. In this case, if aluminum or an aluminum alloy is used as a lower layer of the metal wiring (first wiring), the aluminum or aluminum alloy recoils to form deposits (for example, $AlF_3$ and $Al_2O_3$) in the via-hole. These deposits have insulating properties and thus can cause a defective conduction between the first and second wirings. In a conventional manner the deposits have been removed by so-called wet etching method using hydrofluoric acid aqueous solution.

Such a wet etching method, however, may often etch too much interlayer-dielectric material existing around the deposits. Because hydrofluoric acid is hard to penetrate into the interface of the deposits and the interlayer dielectric film, and thus the interlayer-dielectric film material around the deposits must be much more etched than necessary (refer to FIG. 3). Therefore, the via-hole becomes far larger in diameter than optimal.

The present invention is accomplished in view of the abovementioned problem, and an object thereof is to provide a process for preparing a semiconductor device which is formed with via-holes such as to have an optimal diameter for assuring electrical characteristics thereof.

SUMMARY OF THE INVENTION

According to the present invention, there is provided a process for preparing a semiconductor device comprising the steps of forming a lower wiring of aluminum or an aluminum alloy on a semiconductor substrate, coating said lower wiring with an interlayer dielectric film, forming via-holes in said interlayer dielectric film through a patterned resist by a reactive ion etching method, removing deposits produced by said method in said via-holes and a portion of said interlayer dielectric film around said deposits by means of hydrogen fluoride gas and nitrogen gas in the presence or absence of water vapor, and then forming an upper wiring on said interlayer dielectric film.

The main feature of the invention resides in the use of a mixed gas of hydrogen fluoride and nitrogen in the presence or absence of water vapor for removing unnecessary deposits remaining in a via-hole. The use of such a mixed gas makes it possible to remarkably reduce the amount of an interlayer dielectric film material inevitably removed together with the unnecessary deposits.

DETAILED DESCRIPTION OF THE PREFERRED EMBODIMENTS

Figure 1A:
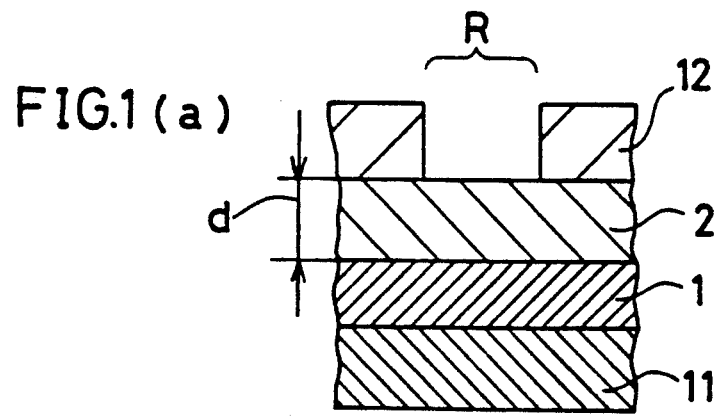
FIGS. 1a-1e are explanatory view illustrating a process of Example 1.

Hereinafter, the present invention will be more fully described with reference to the drawings.

The term "semiconductor substrate" is meant herein by a single-crystal silicon substrate injected or not injected with impurities, and other known substrates.

In the present invention the wiring has a multilayered structure of two or more layers. The aluminum alloy used in the invention for the wiring may contain, for example, 1% of silicon. Any aluminum alloy which is conventionally used for wiring may also be usable in the invention.

An example of the interlayer dielectric film of the invention is an $SiO_2$ film formed by a plasma CVD method to a thickness (d) of preferably 0.5-1.5 $\mu m$, more preferably about 1 $\mu m$ which however is not specifically limited. The interlayer dielectric film may include a so-called PSG film which is a $SiO_2$ film containing phosphorus (P) as impurity formed by CVD method, and a so-called BPSG film being an $SiO_2$ film containing boron (B) and phosphorus (P) as impurities formed by CVD method.

The via-hole is formed by Reactive Ion Etching (RIE) method through a patterned resist. The patterned resist can be formed by a known method, and is used for masking an overall surface of the interlayer dielectric film except an limited area thereof to be etched by RIE method to form the via-hole. The RIE method and the patterned resist enable to form in the interlayer dielectric film a little tapered and vertically extending via-hole 3 of which diameter is, for example, as microscopic as 0.8 $\mu m$ (refer to FIG. 4). In the RIE method often used is $SF_6$ gas or a mixed gas of $CF_4$ and $H_2$. However, another mixed gas containing fluorine may be usable. Known conditions of the RIE method using $SF_6$ gas may be applicable to this invention, for example, the flow rate of $SF_6$ is preferably $10^{-2}$-$10^{-1}$ l/min., and the etching temperature is preferably 20-25° C.

The RIE method is used for forming in the interlayer dielectric film the via-hole for electrically connecting the lower wiring with the upper wiring, and thus the interlayer is etched until the wiring has been exposed, entailing the etching of a top surface of the lower wiring. This etching of the top surface of the lower wiring produces an aluminum halide such as $AlF_3$ resulted from a reaction of ionized etching gas (halide ion such as $F^-$) and Al constituting the lower wiring, and further an aluminum oxide such as $Al_2O_3$ as deposits in the via-hole. Thus, the via-hole is substantially formed, however, the unnecessary deposits are also formed by recoil from the aluminum or aluminum alloy of the lower wiring in etching.

In the present invention a minimal amount of the interlayer dielectric film adjacent the deposits is removed together with the deposits. For this purpose, prior to or after the removal of the patterned resist the semiconductor device is placed under a mixed ga of hydrogen fluoride and nitrogen in the presence or absence of water vapor, this process being so-called HF gas etching, whereby the deposits as well as a minimal amount of the interlayer dielectric film adjacent the deposits can be removed.

In the case of the mixed gas of water vapor, hydrogen fluoride and nitrogen, a ratio of hydrogen fluoride to nitrogen is suitably 0.1-20 wt.%, preferably 1.0-5.0 wt.%, and a ratio of water vapor to nitrogen is preferably 0.01-1.0 wt.%. Whereas in the case of the mixed gas of hydrogen fluoride and nitrogen, a ratio of hydrogen fluoride to nitrogen is suitably 0.1-20 wt.%, preferably 1.0-5.0 wt.%.

Etching time by means of the mixed gas for removing the deposits together with the interlayer dielectric film existing therearound can be properly decided on the basis of the concentration of the mixed gas, for example, in the case of the mixed gas having 0.1 wt.% of $H_2O$ (water vapor) and 1.0 wt.% of HF, the preferred etching time is 5-20 sec., as well in the case of the mixed gas of hydrogen fluoride and nitrogen having 1.0 wt.% of HF, the preferred etching time is also 5-20 sec. In both of the above cases etching time of longer than 60 sec. is not suitable because the lower wiring exposing in the bottom portion of the via-hole is etched too much, whereas etching time of shorter than 2 sec. is also unsuitable because the deposits cannot be completely removed. This etching may be carried out prior to the removal of the resist pattern, but preferable is after the removal thereof.

According to the present invention, the above two mixed gases can easily be inserted into the interface between the deposits and the interlayer dielectric film, thereby enabling to remove the deposits with etching a far less amount of the interlayer dielectric film adjacent the deposits than conventional methods.(The thickness of the interlayer dielectric film to be removed is specifically described later.) In this case, the deposits in the bottom portion of the via-hole can be peeled off from the lower wiring surface in cooperation with the etching of the deposits formed on the wall of the via-hole together with the interlayer dielectric film adjacent thereto. Thus, all the deposits and a small amount of the interlayer dielectric film are etched but remain in the via-hole as residue. The residue is then sucked and removed by a given method such as an ultrasonic cleaning to form a via-hole free from deposits, thereby preventing a conduction defect between the lower wiring and the upper wiring which is to be formed thereafter and also preventing increase in via-hole resistance caused by the deposits.

Figure 2:
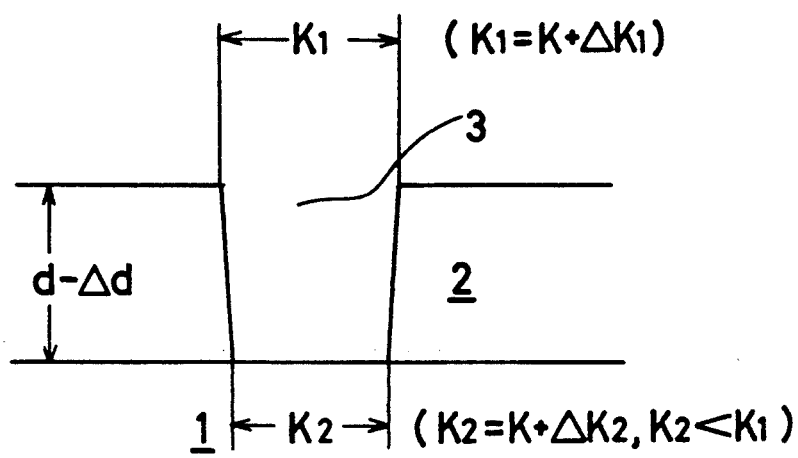
FIG. 2 is a schematic diagram illustrating a via-hole formed by processes of Examples 1 and 2.
Figure 4:
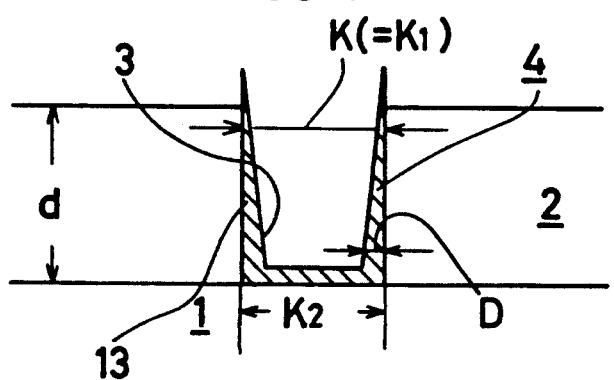
FIG. 4 is a schematic diagram illustrating a state of a via-hole prior to subjecting to a process of the invention.

FIG. 4 illustrates a via-hole formed vertically in an interlayer dielectric film with little tapered wall. In this figure the diameter K of the via-hole is 0.8 $\mu$m, the maximal thickness D of the deposits 4 is 0.1 $\mu$m, and the thickness d of the $SiO_2$ film 2 is 1.0 $\mu$m. In the case of using the mixed gas of water vapor, hydrogen fluoride and nitrogen, the decrease $\Delta d$ in the thickness d of the $SiO_2$ film 2 was 0.05 $\mu$m as shown in FIG. 2. As well, the via-hole 3 was tapered with its uppermost portion diameter $K_1$ and lowermost portion diameter $K_2$ ($K_2 < K_1$), the increase $\Delta K_1$ in the uppermost portion diameter $K_1$ was 0.1 $\mu$m, whereas the increase $\Delta K_2$ in the lowermost portion diameter $K_2$ was 0.05 $\mu$m. If a conventional method is used, the decease in the thickness d of the $SiO_2$ is 0.18-0.22 $\mu$m, the increase in the uppermost portion diameter $K_1$ is 0.36-0.44 $\mu$m, and the increase in the lowermost portion diameter $K_2$ is 0.18-0.22 $\mu$m. When the values given by the present invention are compared with those given by the conventional method, it is apparent that the $SiO_2$ film 2 is not so removed than necessary.

In the present invention the patterned resist is removed if necessary and an Al or Al alloy film as the upper wiring is formed on the $SiO_2$ film and connects to the lower wiring through the via-hole to form a multilayered wiring.

EXAMPLES

Example 1

As shown in FIG. 1(a), on a silicon substrate 11 laminated sequentially were a first Al alloy wiring 1 as the lower wiring, $SiO_2$ film 2 as the interlayer dielectric film, and a resist film 12 (patterned resist) for masking the $SiO_2$ film except the area R destined for a via-hole permitting electric connection between the lower wiring and the upper wiring.

Figure 1B:
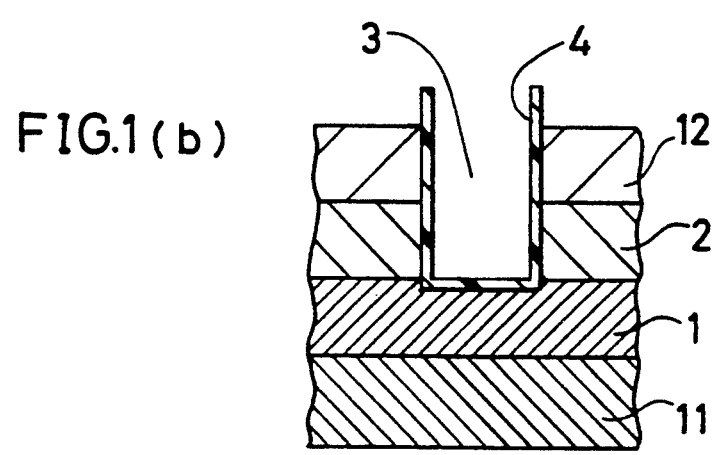
Figure 1C:
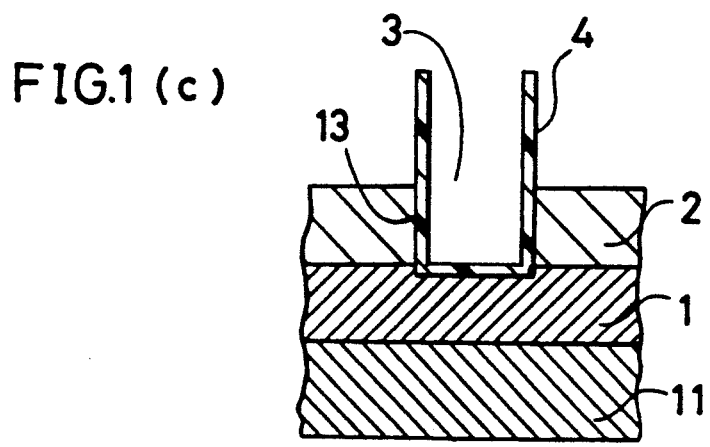
Figure 1D:
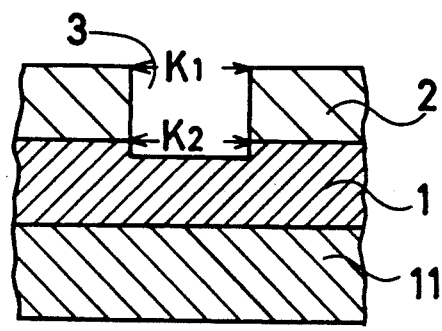

The area R of the $SiO_2$ film 2 was opened by a reactive ion etching method using a mixed gas of $CF_4$ and $H_2$ or $SF_6$ gas as an etching gas to substantially form a via-hole 3 having a vertical wall with little taper as shown in FIG. 1(b). In this case a portion of the top surface of the first Al alloy wiring 1 is etched, and thus deposits 4 considered to be reaction products of Al and the etching gas were adhered to the inside of the via-hole 3. Subsequently the resist film 12 was removed as shown in FIG. 1(c).

Next, the thus treated substrate 11 is placed for 10 sec. in a chamber filled with a mixed gas of water vapor and hydrogen fluoride diluted with nitrogen to remove the deposits 4 together with $SiO_2$ adjacent the interface 13 (refer to FIG. 4) between the deposits 4 and the $SiO_2$ film 2 as shown in FIG. 1 (d). In this case the above mixed gas can be produced, for example, in a manner such that $N_2$ gas is introduced at 3 $\mu$/min. into a water bath to generate water vapor with which 50 cc of hydrogen fluoride and $N_2$ gas then are mixed. The thus obtained mixed gas is introduced into the chamber.

Figure 1E:
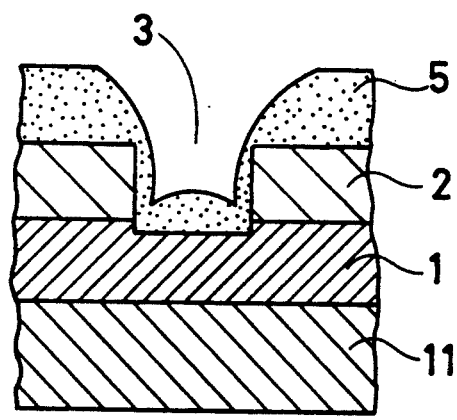

Finally, the thus treated silicon substrate having the via-hole 3 was laminated with an Al alloy film to form a second Al alloy wiring 5 as shown in FIG. 1(e), and thus the first and second wirings were in contact with each other through the via-hole 3, whereby a double-layered wiring was completed.

In this Example, the via-hole 3 from which the deposits 4 have removed is shown in FIG. 2, and data thereof is shown in Table 1.

TABLE 1

|  | Prior to Removal of Deposition | After the removal of Deposition | Variation |
|---|---|---|---|
| Thickness of $SiO_2$ film (d) | 1.0 $\mu$m | 0.95 $\mu$m | $-0.05$ $\mu$m ($-\Delta d$) |
| Uppermost Portion Diameter $K_1$ | 0.8 $\mu$m | 0.90 $\mu$m | $+0.10$ $\mu$m ($=\Delta K_1$) |
| Lowermost Portion Diameter $K_2$ | 0.8 $\mu$m | 0.85 $\mu$m | $+0.05$ $\mu$m ($=\Delta K_2$) |

*The maximal thickness D of the deposits was 0.1 $\mu$m.

Figure 3:
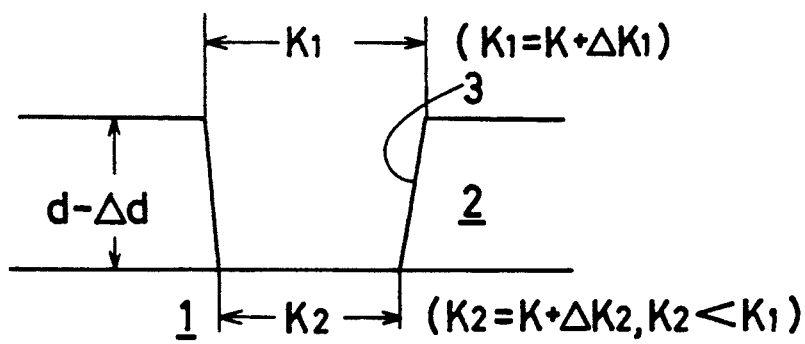
FIG. 3 is a schematic diagram illustrating a via-hole formed by a conventional process.

The same via-hole as shown in FIG. 4 was treated by a conventional method. FIG. 3 illustrates the via-hole having thus treated, and data thereof is shown in Table 2.

TABLE 2

| | Prior to Removal of Deposition | After the removal of Deposition | Variation |
|---|---|---|---|
| Thickness of $SiO_2$ film (d) | 1.0 μm | 0.8 μm | −0.2 μm (−Δd) |
| Uppermost Portion Diameter $K_1$ | 0.8 μm | 1.2 μm | +0.4 μm (=Δ$K_1$) |
| Lowermost Portion Diameter $K_2$ | 0.8 μm | 1.0 μm | +0.2 μm (=Δ$K_2$) |

As can be understood from Tables 1 and 2, the process of the present invention makes it possible to remarkably reduce the amount of $SiO_2$ to be removed comparing with a conventional method.

EXAMPLE 2

A semiconductor device having a double-layered wiring was prepared in the same manner as in Example 1 except that a mixed gas used was a mixed gas of hydrogen fluoride and nitrogen, and the treating time with this mixed gas was 10 sec. In this case the above mixed gas can be produced, for example, in a manner such that a hydrofluoric acid is vaporized by introducing thereinto $N_2$ gas at a flow rate of 2 l/min., and the resulting vapor is diluted with $N_2$ gas at a rate of 4 l/min. The obtained mixed gas is introduced into a chamber of 25° C.

This example also formed the via-hole 3 as shown in FIG. 2, and data thereof is shown in Table 3. Table 3 reveals that the process of the present invention is far superior to the conventional one.

TABLE 3

| | Prior to Removal of Deposition | After the removal of Deposition | Variation |
|---|---|---|---|
| Thickness of $SiO_2$ film (d) | 1.0 μm | 0.95 μm | −0.05 μm (−Δd) |
| Uppermost Portion Diameter $K_1$ | 0.8 μm | 0.90 μm | +0.10 μm (=Δ$K_1$) |
| Lowermost Portion Diameter $K_2$ | 0.8 μm | 0.85 μm | +0.05 μm (=Δ$K_2$) |

As seen in Examples 1 and 2, in course of forming a via-hole for a double-layered wiring of an Al alloy used was the mixed gas of hydrogen fluoride and nitrogen for removing the deposits produced in the via-hole instead of the conventional wet etching using hydrofluoric acid. The mixed gas could easily insert into the interface between the deposits and the interlayer dielectric film, and efficiently remove the deposits with far less amount of the interlayer dielectric film removed than in the conventional manner.

According to the present invention, unnecessary deposits, which are produced in a via-hole when the via-hole is formed by using a reactive ion etching to electrically connect between a multilayered wiring, can be removed together with a minimal amount of an interlayer dielectric film to be inevitably removed. Further, the present invention can prevent a contact portion existing between an upper and lower wirings of Al or an Al alloy from breaking, thereby enabling to provide a semiconductor device of multilayered wiring having assured electric properties.

While only certain preferred embodiments have been described together with the examples, as will be apparent with those familiar with the art, certain changes and modification can be made without departing from the spirit and scope of the invention.

What is claimed is:

1. A process for preparing a semiconductor device comprising the steps of forming a lower wiring of aluminum or an aluminum alloy on a semiconductor substrate, coating said lower wiring with an interlayer dielectric film, forming via-holes in said interlayer dielectric film through a patterned resist by a reactive ion etching method to expose said lower wiring, removing deposits produced by said method in said via-holes and a portion of said interlayer dielectric film around said deposits by means of a mixed gas of hydrogen fluoride gas and nitrogen gas at a ratio of hydrogen fluoride to nitrogen of 0.1-20 wt.% in the absence of water vapor, and then forming upper wiring on said interlayer dielectric film.

2. A process as claimed in claim 1 wherein the interlayer dielectric film is an $SiO_2$ film formed by a plasma CVD method having a thickness of 0.5-1.5 μm.

3. A process as set forth in claim 1 wherein the reactive ion etching step produces deposits including an aluminum oxide and an aluminum halide, the step of removing the deposits including the step of removing the aluminum oxide and aluminum halide deposits.

* * * * *